US012142656B2

(12) United States Patent
Chu et al.

(10) Patent No.: US 12,142,656 B2
(45) Date of Patent: Nov. 12, 2024

(54) STAGGERED STACKED SEMICONDUCTOR DEVICES

(71) Applicant: International Business Machines Corporation, Armonk, NY (US)

(72) Inventors: Albert Chu, Nashua, NH (US); Junli Wang, Slingerlands, NY (US); Albert M. Young, Fishkill, NY (US); Vidhi Zalani, Peekskill, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 538 days.

(21) Appl. No.: 17/541,894

(22) Filed: Dec. 3, 2021

(65) Prior Publication Data

US 2023/0178619 A1    Jun. 8, 2023

(51) Int. Cl.
*H01L 29/423*  (2006.01)
*H01L 21/8234*  (2006.01)
*H01L 27/088*  (2006.01)
*H01L 29/06*  (2006.01)
*H01L 29/786*  (2006.01)

(52) U.S. Cl.
CPC ............ *H01L 29/42392* (2013.01); *H01L 21/823412* (2013.01); *H01L 27/088* (2013.01); *H01L 29/0665* (2013.01); *H01L 29/78696* (2013.01)

(58) Field of Classification Search
CPC ....... H01L 29/42392; H01L 21/823412; H01L 27/088; H01L 29/0665; H01L 29/78696; H01L 27/092; H01L 29/66545; H01L 27/0207; H01L 29/0673; H01L 29/775; H01L 21/823418; H01L 21/823871; H01L 21/8221; H01L 21/823475; H01L 27/0688; H01L 29/4175; H01L 29/66439; H01L 21/823807; B82Y 10/00
See application file for complete search history.

(56) References Cited

U.S. PATENT DOCUMENTS

| | | | |
|---|---|---|---|
| 6,404,308 B1 | 6/2002 | Mattisson | |
| 7,211,885 B2 | 5/2007 | Nordal et al. | |
| 9,659,963 B2 | 5/2017 | Cheng et al. | |
| 10,083,963 B2 * | 9/2018 | Goktepeli | ....... H01L 21/823821 |
| 10,811,415 B2 | 10/2020 | Sengupta et al. | |
| 11,532,627 B2 * | 12/2022 | Liao | ................ H01L 21/823418 |
| 2017/0133408 A1 | 5/2017 | Leng et al. | |
| 2020/0098756 A1 | 3/2020 | Lilak et al. | |

(Continued)

FOREIGN PATENT DOCUMENTS

| | | |
|---|---|---|
| CN | 113078154 A | 7/2021 |
| TW | 201419450 A | 5/2014 |

(Continued)

*Primary Examiner* — Allison Bernstein
(74) *Attorney, Agent, or Firm* — Samuel Waldbaum; Ryan, Mason & Lewis, LLP

(57) ABSTRACT

A semiconductor structure includes a first transistor device comprising a plurality of channel regions. The semiconductor structure further includes a second transistor device comprising a plurality of channel regions. The first transistor device and the second transistor device are disposed in a stacked configuration. The plurality of channel regions of the first transistor device are disposed in a staggered configuration relative to the plurality of channel regions of the second transistor device.

25 Claims, 18 Drawing Sheets

(56) References Cited

U.S. PATENT DOCUMENTS

| | | | |
|---|---|---|---|
| 2020/0126987 A1* | 4/2020 | Rubin | H01L 29/0847 |
| 2020/0235092 A1 | 7/2020 | Lilak et al. | |
| 2020/0273882 A1 | 8/2020 | Wang et al. | |
| 2020/0411539 A1 | 12/2020 | She et al. | |
| 2021/0320130 A1 | 2/2021 | Westerhoff et al. | |
| 2021/0296314 A1 | 9/2021 | Kang et al. | |
| 2021/0313326 A1 | 10/2021 | Lim et al. | |
| 2021/0366907 A1 | 11/2021 | Liao et al. | |
| 2023/0402519 A1* | 12/2023 | Anderson | H01L 21/8221 |
| 2024/0064951 A1* | 2/2024 | Chu | H01L 21/8221 |

FOREIGN PATENT DOCUMENTS

| | | |
|---|---|---|
| TW | 201611280 A | 3/2016 |
| TW | 201832363 A | 2/2017 |
| TW | 202044417 A | 12/2020 |
| TW | 202101679 A | 1/2021 |
| TW | 202118022 A | 5/2021 |
| WO | 20180118210 A1 | 6/2018 |
| WO | PCT/EP2022/082876 | 2/2023 |

* cited by examiner

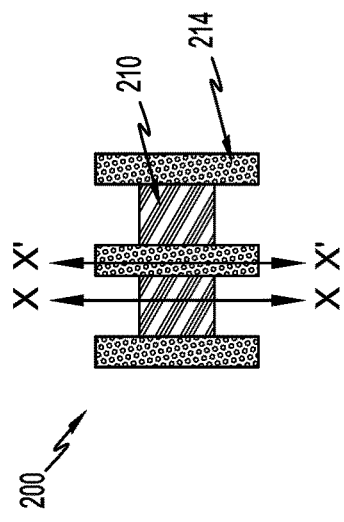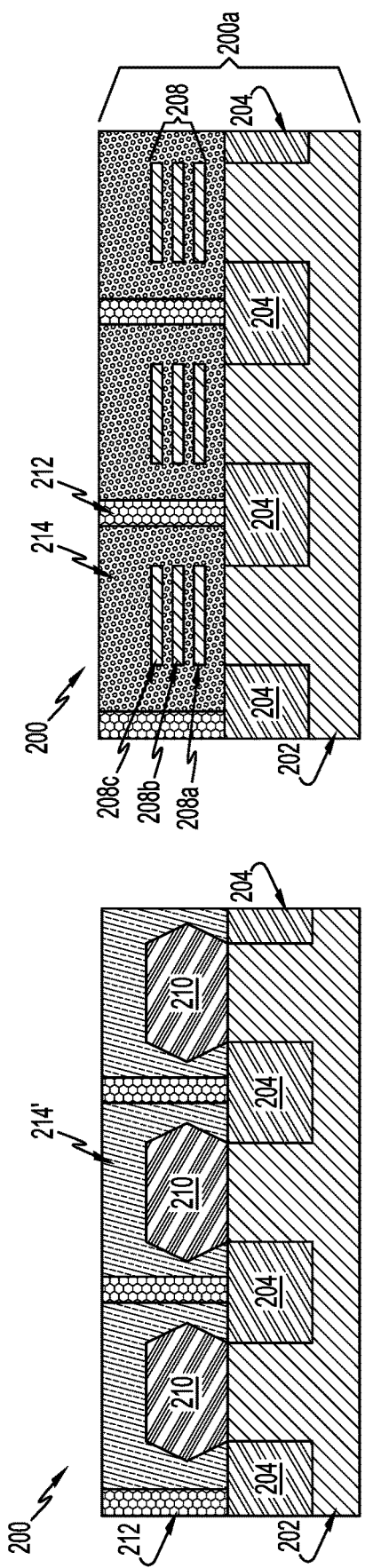

STAGGERED STACKED SEMICONDUCTOR DEVICES

BACKGROUND

This disclosure relates generally to semiconductor fabrication techniques and, in particular, to structures and methods for fabricating semiconductor devices. The semiconductor integrated circuit (IC) industry has experienced rapid growth. In the course of the IC evolution, functional density (i.e., the number of interconnected devices per chip area) has generally increased while geometry size (i.e., the smallest component (e.g., line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

SUMMARY

Illustrative embodiments include structures and methods for forming staggered stacked semiconductor devices.

In one exemplary embodiment, a semiconductor structure comprises a first transistor device. The first transistor device comprises a plurality of channel regions. The semiconductor structure further comprises a second transistor device. The second transistor device comprises a plurality of channel regions. The first transistor device and the second transistor device are disposed in a stacked configuration. The plurality of channel regions of the first transistor device are disposed in a staggered configuration relative to the plurality of channel regions of the second transistor device.

The semiconductor structure of the illustrative embodiment advantageously allows for formation of a middle-of-the-line and/or other contacts. In addition, the staggered configuration of the semiconductor structure of the illustrative embodiment advantageously improves the contact landing and local interconnects without incurring any area penalty.

In one or more additional illustrative embodiments, the first transistor device may further comprise a first gate structure disposed on and around each channel region. The second transistor device may further comprise a second gate structure disposed on and around each channel region. The semiconductor structure may further comprise at least one of the first gate structures of the channel regions of the first transistor device being interconnected with a respective second gate structure of the channel region of the second transistor device.

In one or more additional illustrative embodiments, the semiconductor structure may further comprise a first metal interconnect and a second metal interconnect. The semiconductor structure may further comprise where each of the first metal interconnect and the second metal interconnect are disposed in one or more of a frontside and a backside of the semiconductor structure.

In one or more additional illustrative embodiments, the first transistor device may further comprise a first source/drain region disposed on and around each of the channel regions. The second transistor device may further comprise a second source/drain region disposed on and around each of the channel regions.

In one or more additional illustrative embodiments, a given one of a second source/drain region of a respective channel region of the second transistor device and a given one of a first source/drain region of a respective channel region of the first transistor device may be interconnected with a metal interconnect.

In one or more additional illustrative embodiments, the staggered configuration may comprise the plurality of channel regions of the first transistor device being disposed in an overlap configuration relative to the plurality of channel regions of the second transistor device.

In one or more additional illustrative embodiments, the first transistor device may be one of a nanosheet-type field effect transistor device and a fin-type field effect transistor device. The second transistor device may be another one of a nanosheet-type field effect transistor device and a fin-type field effect transistor device.

In one or more additional illustrative embodiments, the semiconductor structure may be part of a logic device.

Another exemplary embodiment comprises an integrated circuit comprising one or more semiconductor structures. At least one of the one or more semiconductor structures is a semiconductor structure according to one or more of the foregoing embodiments.

In yet another exemplary embodiment, a semiconductor structure comprises a first transistor device. The first transistor device comprises a plurality of channel regions. The semiconductor structure further comprises a second transistor device. The second transistor device comprises a plurality of channel regions. The semiconductor structure further comprises a first metal interconnect and a second metal interconnect. Each of the first metal interconnect and the second metal interconnect is disposed in at least one side of the semiconductor structure. The first transistor device and the second transistor device are in a stacked configuration. The plurality of channel regions of the first transistor device are in a staggered configuration relative to the plurality of channel regions of the second transistor device.

The semiconductor structure of the illustrative embodiment advantageously allows for formation of a middle-of-the-line and/or other contact. In addition, the staggered configuration of the semiconductor structure of the illustrative embodiment improves the contact landing and local interconnects without incurring any area penalty.

In one or more additional illustrative embodiments, the at least one side of the semiconductor structure that the first metal interconnect and the second metal interconnect are disposed in may be at least one of a frontside and a backside of the semiconductor structure.

In one or more additional illustrative embodiments, the first transistor device may further comprise a first source/drain region disposed on and around each of the channel regions, and the second transistor device may further comprise a second source/drain region disposed on and around each of the channel regions.

In one or more additional illustrative embodiments, a given one of a second source/drain region of a respective channel region of the second transistor device and a given one of a first source/drain region of a respective channel region of the first transistor device may be interconnected with a third metal interconnect.

In one or more additional illustrative embodiments, the staggered configuration may comprise the plurality of channel regions of the first transistor device being in an overlap configuration relative to the plurality of channel regions of the second transistor device.

In one or more additional illustrative embodiments, the first transistor device may be one of a nanosheet-type field effect transistor device and a fin-type field effect transistor device, while the second transistor device may be another one of a nanosheet-type field effect transistor device and a fin-type field effect transistor device.

In one or more additional illustrative embodiments, the semiconductor structure may comprise a first gate structure disposed on and around each channel region of the first transistor device, and a second gate structure disposed on and around each channel region of the second transistor device. The semiconductor structure may further comprise at least one of the first gate structures of the channel regions of the first transistor device being interconnected with a respective second gate structure of the channel region of the second transistor device.

In one or more additional illustrative embodiments, the first metal interconnect and the second metal interconnect may be each disposed in a frontside or a backside of the semiconductor structure. Alternatively, one of the first metal interconnect and the second metal interconnect may be disposed in the frontside and the other of the first metal interconnect and the second metal interconnect may be disposed in the backside of the semiconductor structure.

In a further exemplary embodiment, a method for fabricating a semiconductor structure comprises forming a first transistor device comprising a plurality of channel regions, and forming a second transistor device comprising a plurality of channel regions. The first transistor device and the second transistor device are formed in a stacked configuration. The plurality of channel regions of the first transistor device are formed in a staggered configuration relative to the plurality of channel regions of the second transistor device.

In still a further exemplary embodiment, a method for fabricating a semiconductor structure comprises forming a first transistor device comprising a plurality of channel regions, forming a second transistor device comprising a plurality of channel regions, forming a first metal interconnect, and forming a second metal interconnect. The first metal interconnect and the second metal interconnect are formed in at least one side of the semiconductor structure. The first transistor device and the second transistor device are formed in a stacked configuration. The plurality of channel regions of the first transistor device are formed in a staggered configuration relative to the plurality of channel regions of the second transistor device.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 3A is a top view illustrating the semiconductor structure at a second-intermediate fabrication stage, according to an illustrative embodiment.

FIG. 3B is a cross-sectional view illustrating the semiconductor structure taken along the X-X axis of FIG. 3A at the second-intermediate fabrication stage, according to an illustrative embodiment.

FIG. 3C is a cross-sectional view of the semiconductor structure taken along the X'-X' axis of FIG. 3A at the second-intermediate fabrication stage, according to an illustrative embodiment.

DETAILED DESCRIPTION

This disclosure relates generally to techniques for fabricating semiconductor devices.

For example, a field effect transistor (FET) device is a semiconductor device that controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material. A nanosheet FET transistor typically includes a substrate, an isolation layer, a number of vertically stacked nanosheets forming a channel, and a gate. A nanosheet is formed of a thin layer of semiconductor channel material having a vertical thickness that is less than a width of the material.

Another example of a semiconductor device is a nanosheet FET transistor device. Known nanosheet FET transistor devices include a substrate, an isolation layer, a number of vertically stacked nanosheets forming a channel, and a gate. A nanosheet is formed of a thin layer of semiconductor channel material having a vertical thickness that is less than a width of the material.

Another example of a semiconductor device is a fin-type field effect transistor (FinFET) device. Known FinFET devices include fins with source/drain regions on lateral sides of the fins, so that current flows in a horizontal direction (e.g., parallel to a substrate) between source/drain regions at opposite ends of the fins in the horizontal direction.

Another example of a semiconductor device is a vertical field effect transistor (VFET) (also referred to as vertical transport field effect transistors (VTFETs)) device. VFET devices include fin channels with source/drain regions at ends of the fin channels on top and bottom sides of the fins. Current flows through the fin channels in a vertical direction (e.g., perpendicular to a substrate), for example, from a bottom source/drain region to a top source/drain region.

Figure 1:
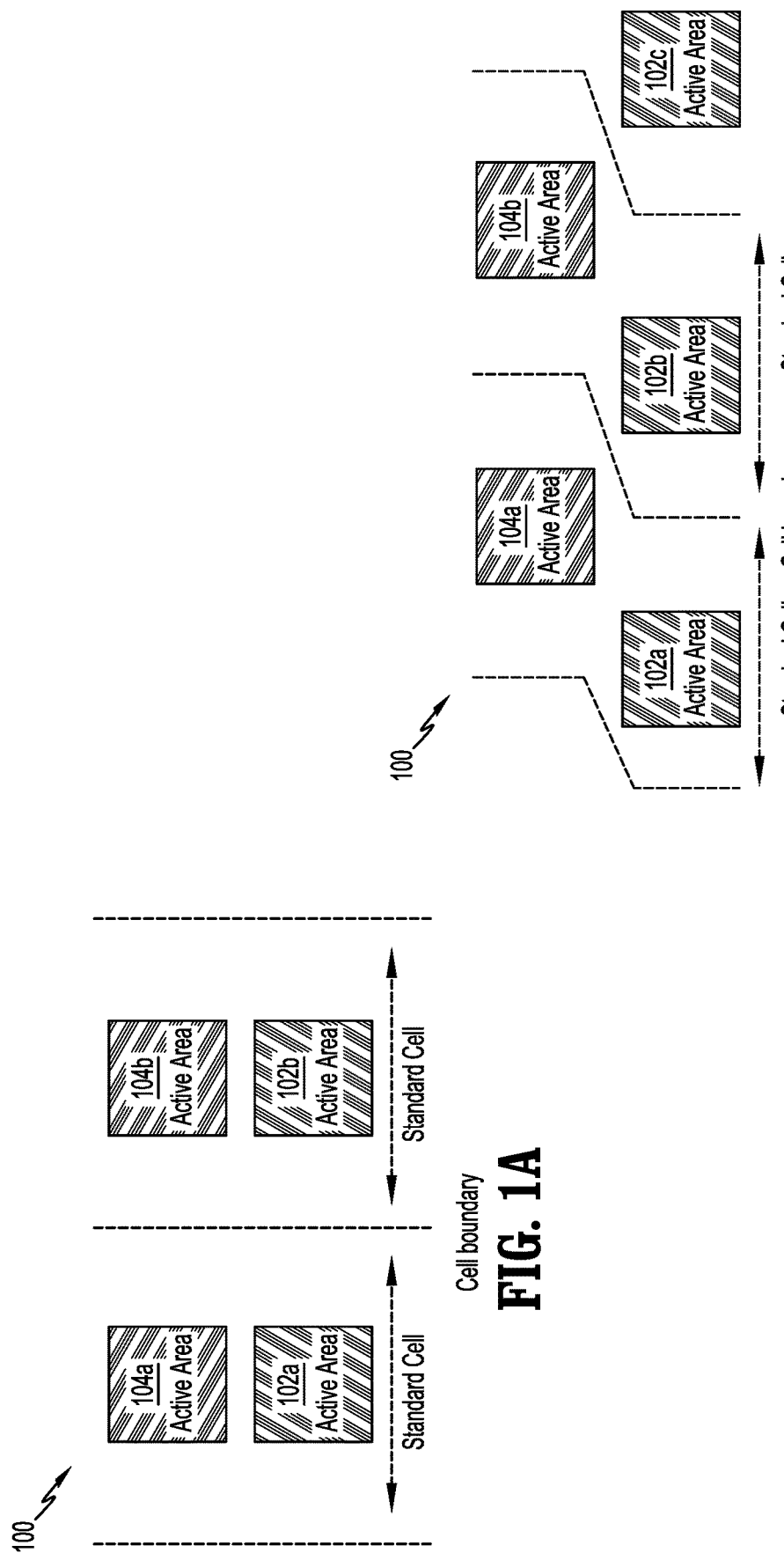
FIG. 1A illustrates a conventional semiconductor structure having vertical stacked devices on top of each other.
FIG. 1B illustrates a semiconductor structure having vertical staggered stacked devices, according to an illustrative embodiment.

In general, a vertical stacked device architecture places one type of device on top of another type of device to form a vertical complementary metal oxide semiconductor field effect transistor (CMOS). For example, FIG. 1A shows a typical design style in which vertical stacked structure 100 has a top device with active areas 104a and 104b stacked directly on a bottom device with active areas 102a and 102b. In this type of stacked configuration, the cell boundary for the top active areas 104a and 104b is aligned with the cell boundary with the respective bottom active areas 102a and 102b. The challenge from this design style is that the top active area will block the bottom device area. This results in process integration challenges such as, for example, in forming a middle-of-the-line (MOL) contact. This challenge will also cause design complexity for standard cell design.

Illustrative embodiments described herein overcome the above-mentioned challenges by forming staggered stacked vertical semiconductor devices, i.e., the active areas of the top device and the active areas of the bottom device are in a staggered configuration. In particular, FIG. 1B shows vertical stacked structure 100 having a top semiconductor device with top active areas 104a and 104b in a staggered configuration relative to a bottom semiconductor device with respective bottom active areas 102a-102c. In this type of configuration, the cell boundary for the active areas of the top device is not aligned with the cell boundary of the respective active areas of the bottom device. This staggered configuration will improve the contact landing and local interconnects without occurring any area penalty.

It is to be understood that the various layers and/or regions shown in the accompanying drawings are not drawn to scale, and that one or more layers and/or regions of a type commonly used in, for example, field-effect transistor (FET), FinFET, VFET, CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the terms "about" or "substantially" as used herein imply that a small margin of error may be present, such as 1% or less than the stated amount.

The semiconductor devices and methods for forming same in accordance with embodiments described herein can be employed in applications, hardware, and/or electronic systems. Suitable hardware and systems for implementing illustrative embodiments may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments. Given the teachings of illustrative embodiments provided herein, one of ordinary skill in the art will be able to contemplate other implementations and applications of embodiments described herein.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Referring now to the drawings in which like numerals represent the same of similar elements, FIGS. 2-13B illustrate various processes for fabricating a semiconductor structure with a vertical staggered top device and bottom device in accordance with illustrative non-limiting embodiments. For example, other processes are envisioned for fabricating a semiconductor structure with a vertical staggered, stacked top device and bottom device in accordance with this disclosure. Note that the same reference numeral (200) is used to denote the semiconductor structure through the various intermediate fabrication stages illustrated in FIGS. 2-13B. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 2-13B are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Figure 2:
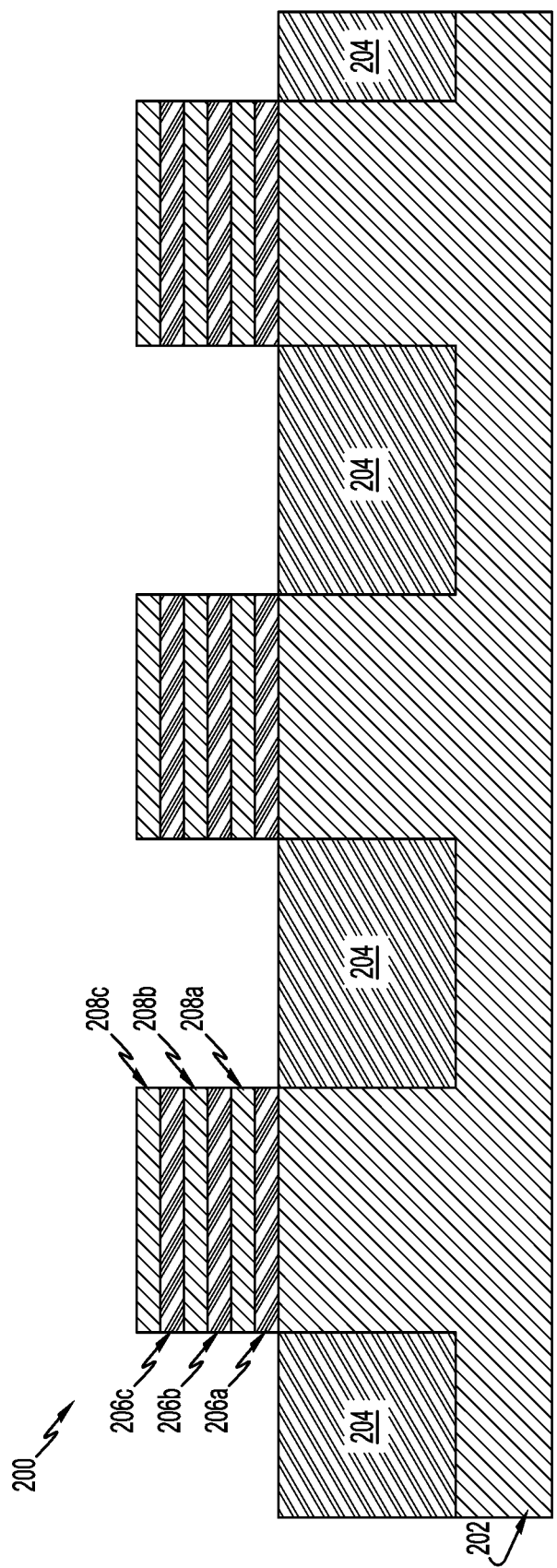
FIG. 2 is a schematic cross-sectional side view of a semiconductor structure at a first-intermediate stage of fabrication, according to one or more illustrative embodiments.
Figure 4:
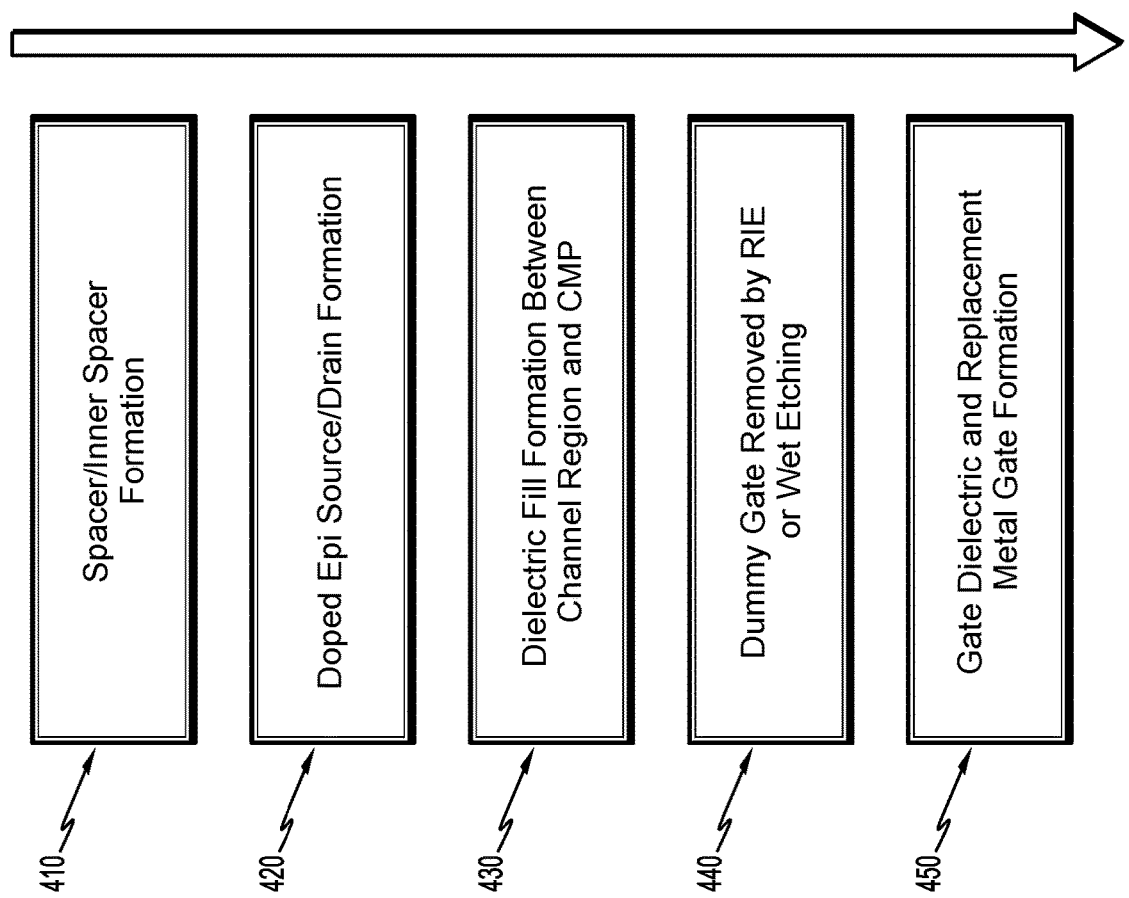
FIG. 4 is a flow diagram illustrating steps for forming the semiconductor structure of FIGS. 3A and 3B, according to an illustrative embodiment.
Figure 5:
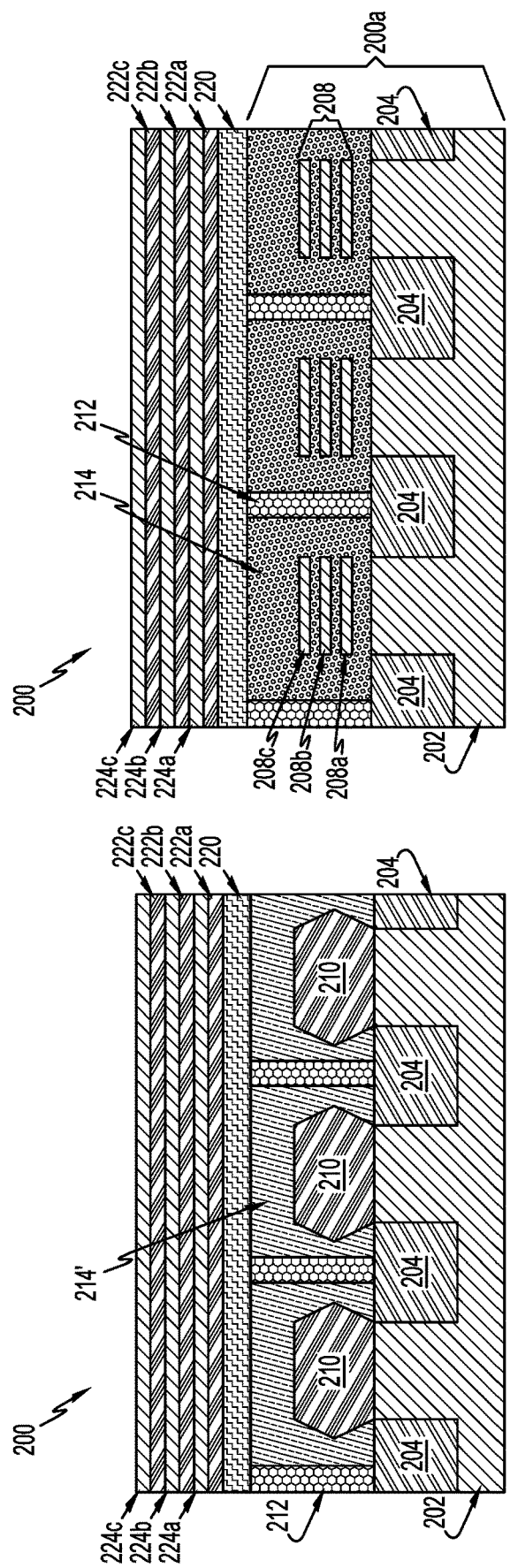
FIG. 5A is a cross-sectional view illustrating the semiconductor structure taken along the X-X axis of FIG. 3A at a third-intermediate fabrication stage, according to an illustrative embodiment.
FIG. 5B is a cross-sectional view of the semiconductor structure taken along the X'-X' axis of FIG. 3A at the third-intermediate fabrication stage, according to an illustrative embodiment.
Figure 6:
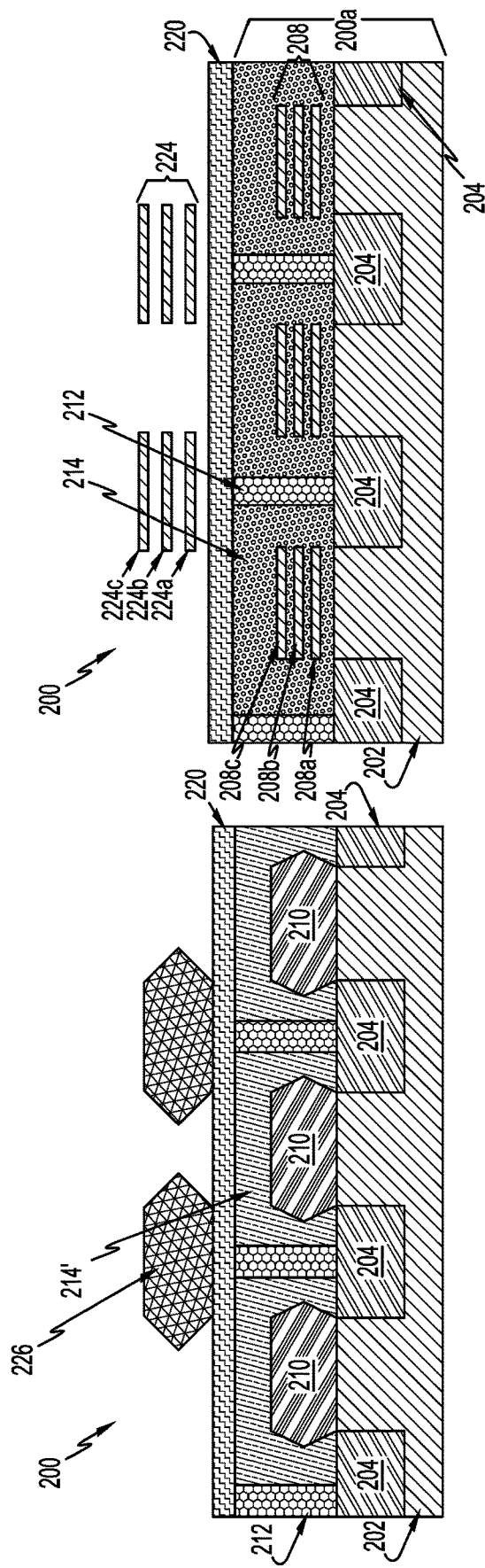
FIG. 6A is a cross-sectional view illustrating the semiconductor structure taken along the X-X axis of FIG. 3A at a fourth-intermediate fabrication stage, according to an illustrative embodiment.
FIG. 6B is a cross-sectional view of the semiconductor structure taken along the X'-X' axis of FIG. 3A at the fourth-intermediate fabrication stage, according to an illustrative embodiment.
Figure 7:
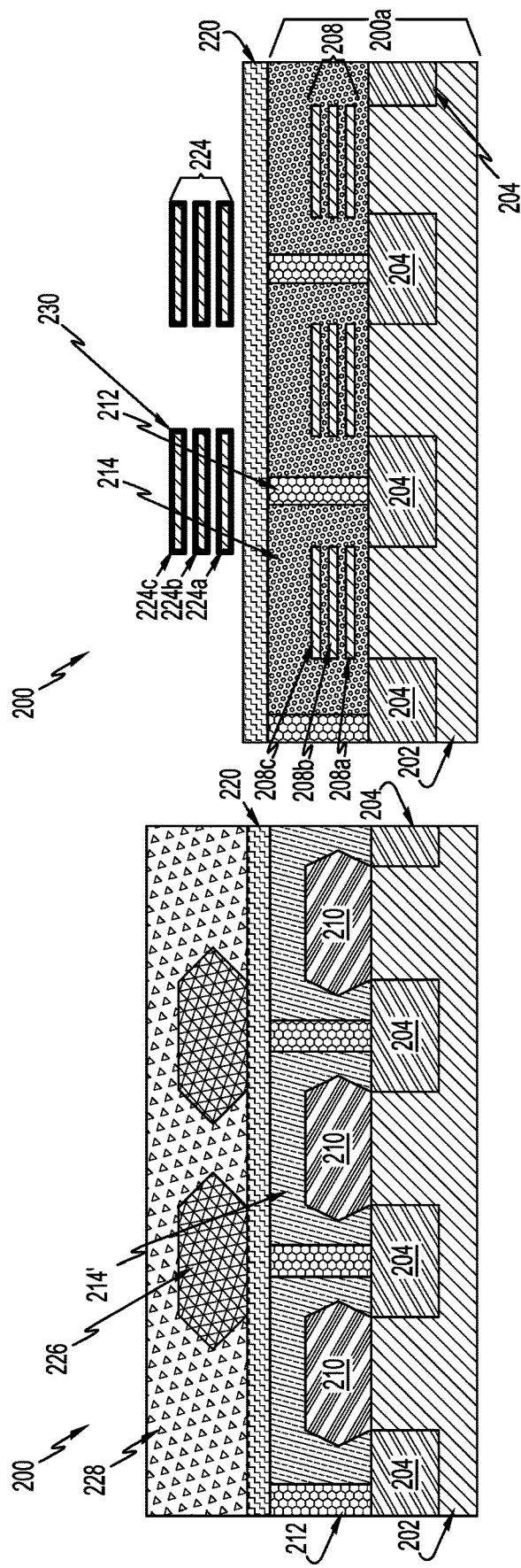
FIG. 7A is a cross-sectional view illustrating the semiconductor structure taken along the X-X axis of FIG. 3A at a fifth-intermediate fabrication stage, according to an illustrative embodiment.
FIG. 7B is a cross-sectional view of the semiconductor structure taken along the X'-X' axis of FIG. 3A at the fifth-intermediate fabrication stage, according to an illustrative embodiment.
Figure 8:
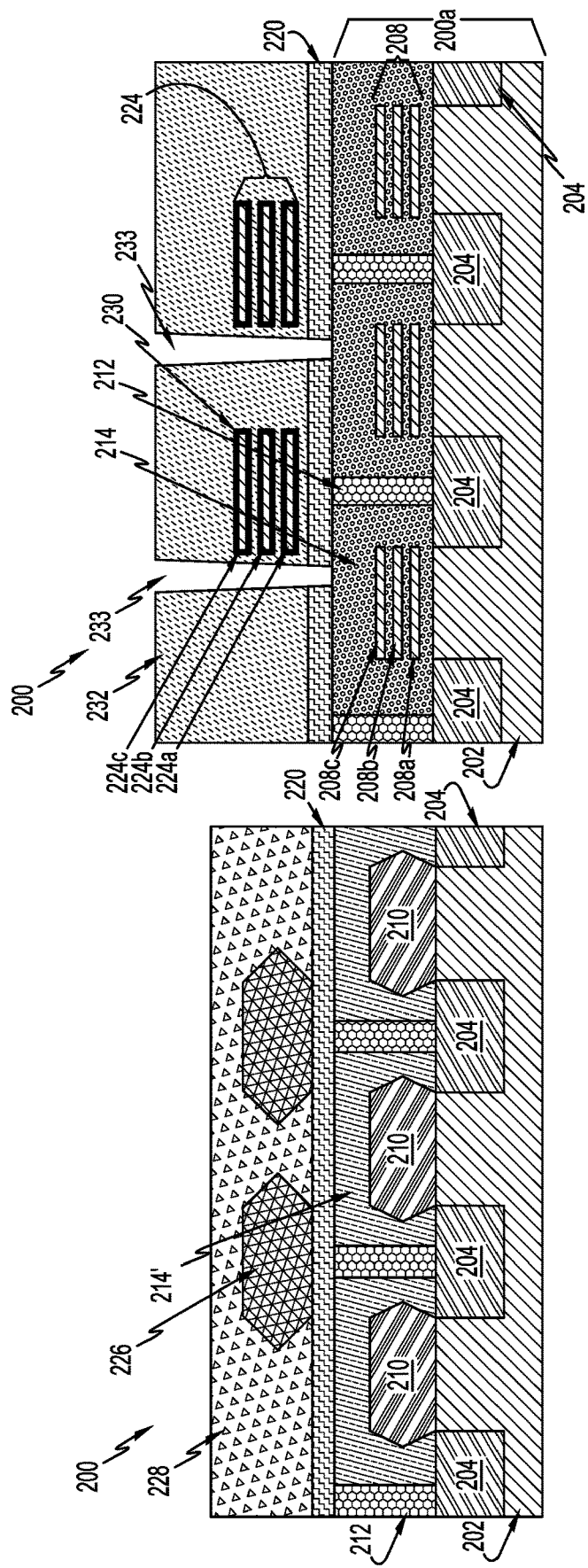
FIG. 8A is a cross-sectional view illustrating the semiconductor structure taken along the X-X axis of FIG. 3A at a sixth-intermediate fabrication stage, according to an illustrative embodiment.
FIG. 8B is a cross-sectional view of the semiconductor structure taken along the X'-X' axis of FIG. 3A at the sixth-intermediate fabrication stage, according to an illustrative embodiment.
Figure 9:
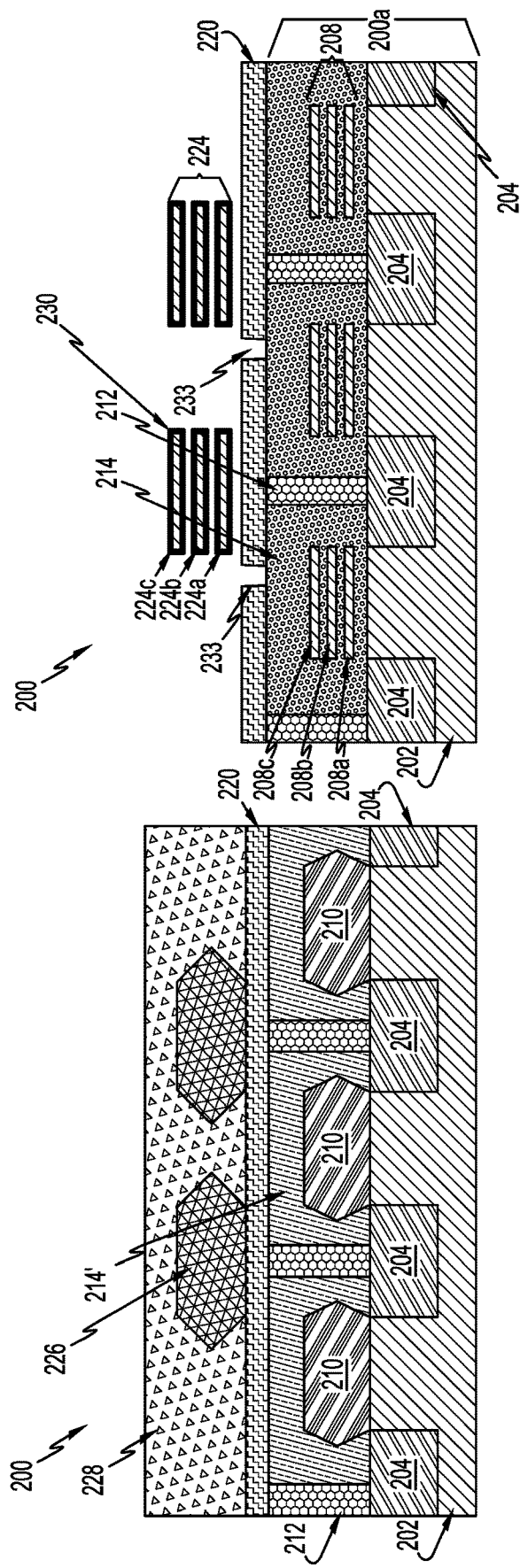
FIG. 9A is a cross-sectional view illustrating the semiconductor structure taken along the X-X axis of FIG. 3A at a seventh-intermediate fabrication stage, according to an illustrative embodiment.
FIG. 9B is a cross-sectional view of the semiconductor structure taken along the X'-X' axis of FIG. 3A at the seventh-intermediate fabrication stage, according to an illustrative embodiment.
Figure 10:
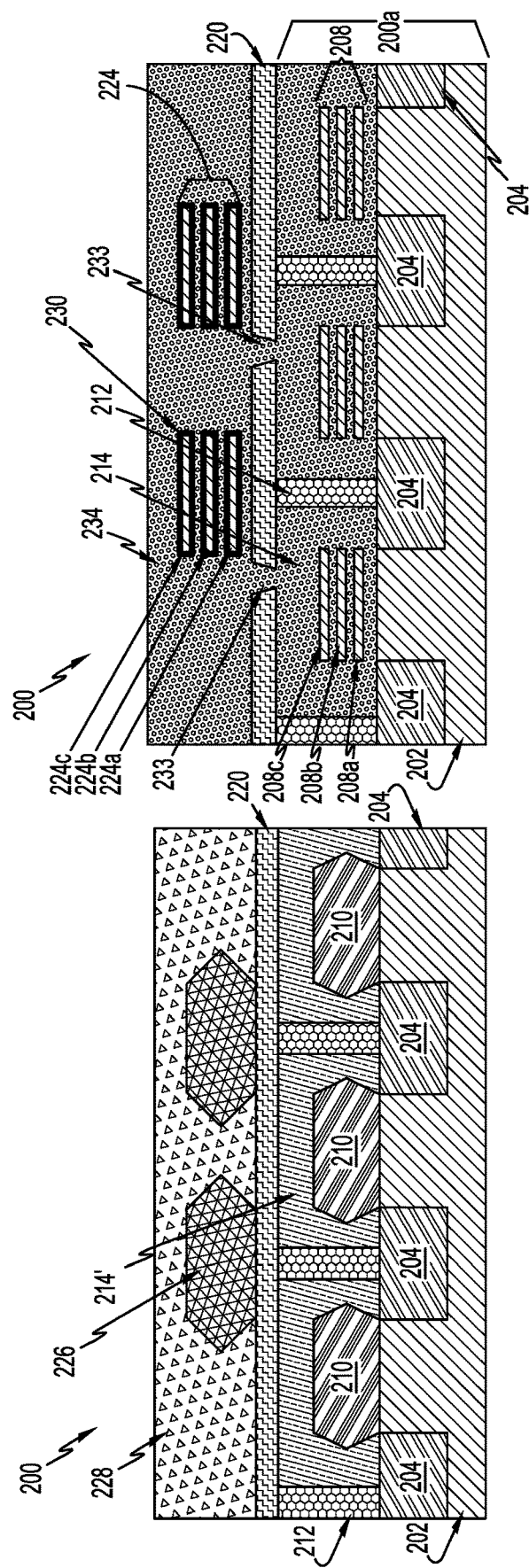
FIG. 10A is a cross-sectional view illustrating the semiconductor structure taken along the X-X axis of FIG. 3A at an eighth-intermediate fabrication stage, according to an illustrative embodiment.
FIG. 10B is a cross-sectional view of the semiconductor structure taken along the X'-X' axis of FIG. 3A at the eighth-intermediate fabrication stage, according to an illustrative embodiment.
Figure 11:
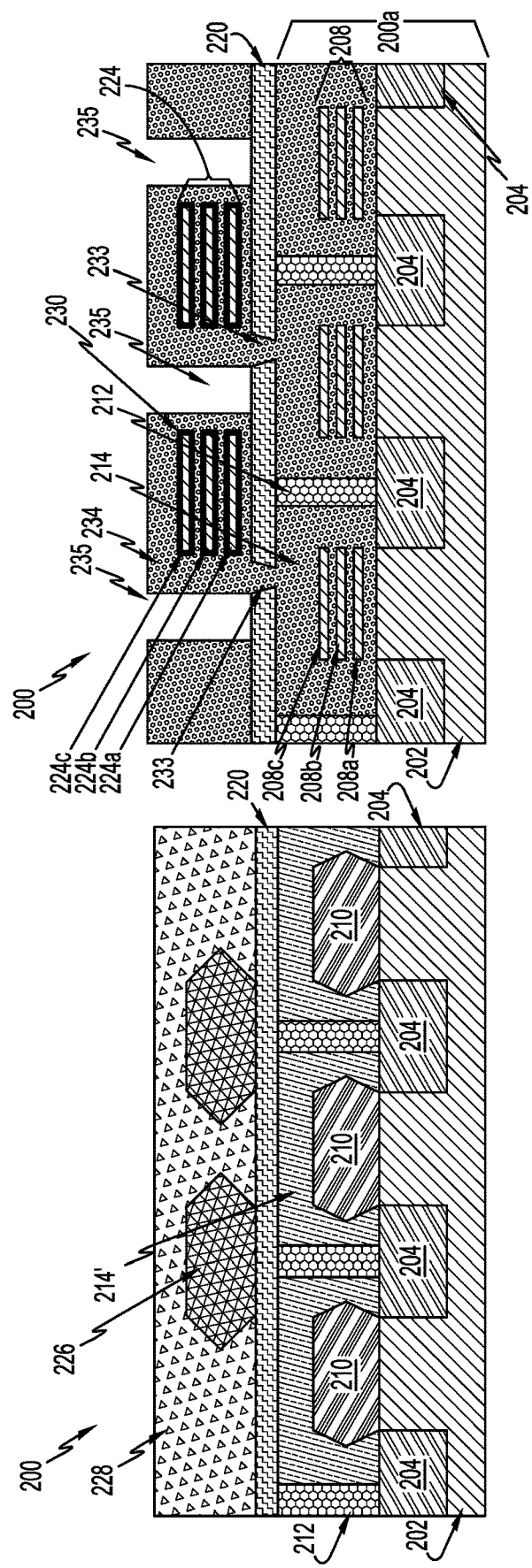
FIG. 11A is a cross-sectional view illustrating the semiconductor structure taken along the X-X axis of FIG. 3A at a ninth-intermediate fabrication stage, according to an illustrative embodiment.
FIG. 11B is a cross-sectional view of the semiconductor structure taken along the X'-X' axis of FIG. 3A at the ninth-intermediate fabrication stage, according to an illustrative embodiment.
Figure 12:
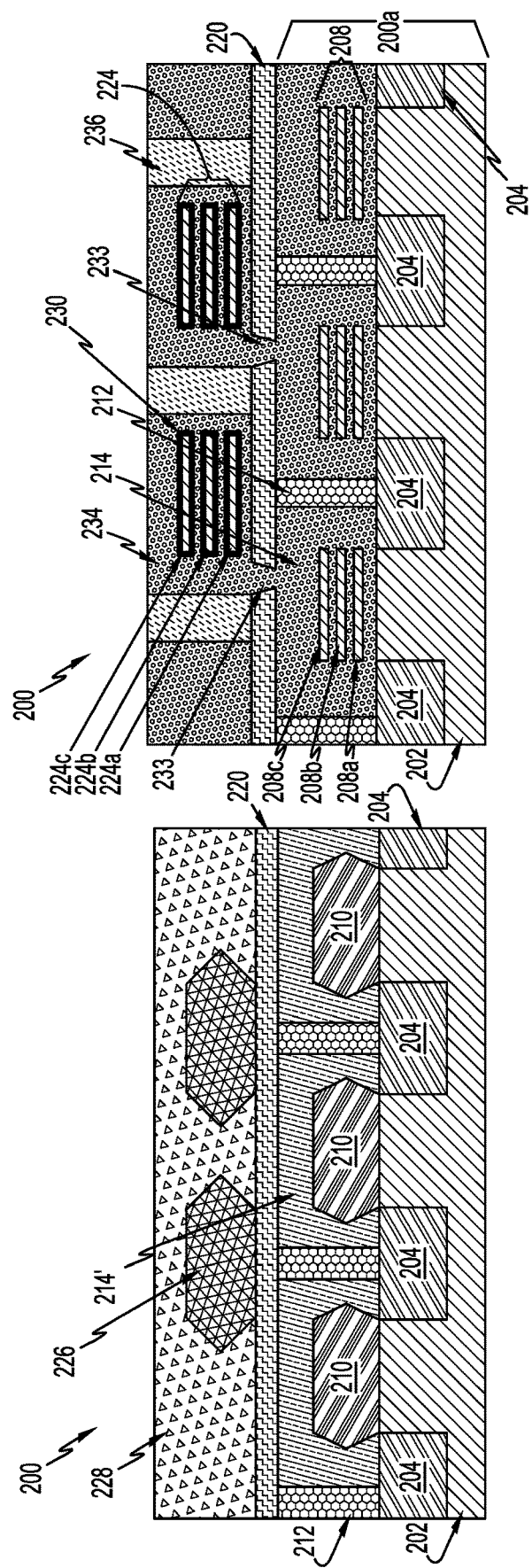
FIG. 12A is a cross-sectional view illustrating the semiconductor structure taken along the X-X axis of FIG. 3A at a tenth-intermediate fabrication stage, according to an illustrative embodiment.
FIG. 12B is a cross-sectional view of the semiconductor structure taken along the X'-X' axis of FIG. 3A at the tenth-intermediate fabrication stage, according to an illustrative embodiment.
Figure 13:
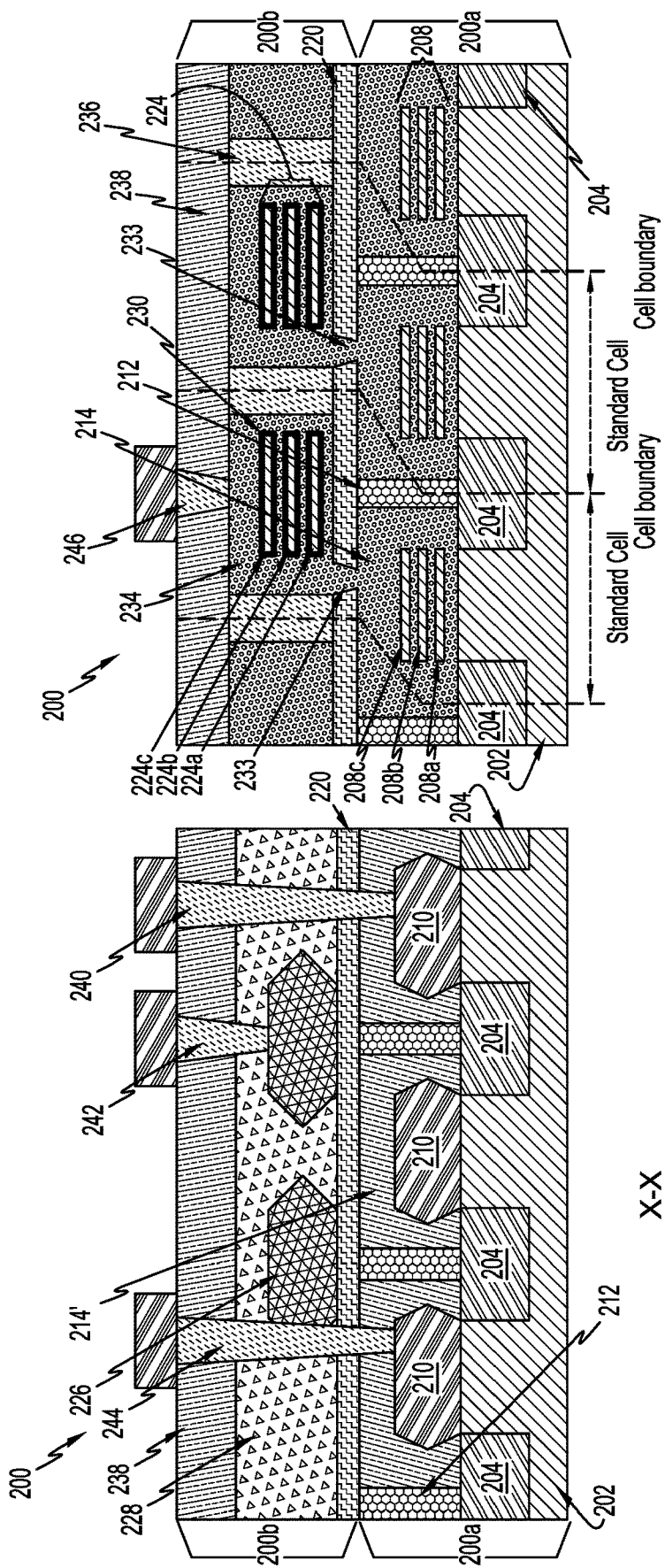
FIG. 13A is a cross-sectional view illustrating the semiconductor structure taken along the X-X axis of FIG. 3A at an eleventh-intermediate fabrication stage, according to an illustrative embodiment.
FIG. 13B is a cross-sectional view of the semiconductor structure taken along the X'-X' axis of FIG. 3A at the eleventh-intermediate fabrication stage, according to an illustrative embodiment.

FIG. 2 illustrates semiconductor structure 200 at a first-intermediate fabrication stage. Semiconductor structure 200 includes semiconductor substrate 202 which can be composed of any currently known or later developed semiconductor material. For example, semiconductor substrate 202 may comprise a silicon on insulator (SOI) substrate wafer of a conventional type such as, for example, an extremely thin silicon on insulator (ETSOI) or ultra-thin body and buried oxide (UTBB) silicon on insulator (SOI) known to those skilled in the art. Alternatively, the semiconductor substrate 202 may comprise a bulk semiconductor substrate wafer. In one embodiment, semiconductor substrate 202 is a layered silicon-insulator-silicon substrate. In another embodiment, semiconductor substrate 202 is a silicon (Si) substrate.

Semiconductor structure 200 further includes shallow trench isolation (STI) region 204 in semiconductor substrate 202. STI region 204 comprises a dielectric material such as silicon oxide or silicon oxynitride, and is formed by methods known in the art. For example, in one illustrative embodiment, STI region 204 is a shallow trench isolation oxide layer.

Semiconductor structure 200 further includes a nanosheet stack composed of sacrificial layers 206a-206c alternatingly formed with channel layers 208a-208c. Although three channel layers 208a-208c are shown, any number of channel layers can be used, and the number of sacrificial layers will be increased or decreased accordingly. Channel layers 208a-208c collectively form a channel region 208 (see FIG. 3C) as discussed below when forming a replacement metal gate. Suitable material for the channel layers 208a-208c includes, for example, Si. Suitable material for the sacrificial layers 206a-206c can be, for example, $SiGe_x$ % where the atomic percent % for "x" ranges from about 15 to about 85% atomic percent. The thickness or height of each sacrificial layer 206a-206c can range from about 5 nanometers (nm) to about 15 nm, and the height of each channel layer 208 can range from about 5 nm to about 15 nm.

FIGS. 3A-3C illustrate semiconductor structure 200 at a second-intermediate fabrication stage and the formation of bottom device 200a. Several fabrication steps leading up to the production of the semiconductor structure 200 illustrated in FIGS. 3A-3C have been omitted. These steps are well known to one skilled in the art. However, for sake of completeness, these steps are generally illustrated in the flow diagram of FIG. 4. For example, step 410 involves forming inner spacers in channel layers 208 and a sidewall spacer on a dummy gate. Step 420 involves forming the source/drain regions 210. Step 430 involves depositing the ILD layer 212 between channel regions. Step 440 involves removing a dummy gate and sacrificial layers 206a-206c by a suitable etching process including, for example, a dry etch process such as reactive ion etching (RIE), or a wet etching. Step 450 involves forming replacement metal gate 214 to form channel region 208 defined by channel layers 208a-208c.

In particular, as shown in FIGS. 3A-3C, semiconductor structure 200 includes source/drain region 210 on substrate 202. Source/drain region 210 can be formed on substrate 202, around the sidewalls of channel layers 208a-208c, inner spacers (not shown) and on a portion of sidewall spacer (not shown). The source/drain regions 210 can be epitaxially grown and in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Suitable dopants include, for example, an n-type dopant selected from a group of phosphorus (P), arsenic (As) and antimony (Sb), or a p-type dopant selected from a group of boron (B), gallium (Ga), indium (In), and thallium (Tl) at various concentrations depending on which type of device is being formed. In a non-limiting example, a dopant concentration range may be $1\times10^{18}/cm^3$ to $1\times10^{21}/cm^3$. It is to be understood that the term "source/drain region" as used herein means that a given source/drain region can be either a source region or a drain region, depending on the application.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from about 500° C. to about 900° C. Although higher temperature typically results in faster deposition, the faster deposition may result in crystal defects and film cracking.

Semiconductor structure 200 further includes an interlayer dielectric (ILD) layer 212. The ILD layer 212 includes, for example, any suitable dielectric material such as silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high-density plasma oxide, borophosphosilicate glass (BPSG), or any combination thereof. ILD layer 212 is formed using any suitable deposition techniques including chemical vapor deposition (CVD), low-pressure CVD (LPCVD), plasma-enhanced CVD (PECVD), physical vapor deposition (PVD), atomic layer deposition (ALD), chemical solution deposition or other like processes. ILD layer 212 can be planarized by, for example, a planarization process such as a chemical mechanical planarization (CMP) operation Semiconductor structure 200 further includes channel layers 208a-208c with replacement metal gate 214 (see FIG. 3C). The replacement metal gate structure depicted herein is intended to be representative in nature of any type of gate structure that may be employed in manufacturing integrated circuit products using so-called gate-last (replacement gate) manufacturing techniques. The replacement gate structure typically comprises a high-k (e.g., a k value greater than 5 or greater than 10) dielectric layer, such as hafnium oxide, one or more metal layers (e.g., layers of titanium nitride or TiAlC depending upon the type of transistor device being manufactured), and a bulk conductive material layer, such as tungsten or aluminum. As one skilled in the art will readily appreciate, the metal gate projection 214' of replacement metal gate 214 is shown in the cross-section of FIG. 3B.

FIGS. 5A and 5B illustrate semiconductor structure 200 at a third-intermediate fabrication stage for forming a top device (see device 200b in FIGS. 13A and 13B). During this stage, a substrate 220 is bonded to the top surface of the bottom device 200a by, for example, a suitable adhesive such as an epoxy. Substrate 220 can be of a similar material as discussed above for substrate 202. Substrate 220 further includes sacrificial layers 222a-222c alternatingly formed with channel layers 224a-224c. Although three channel layers are shown, any number of channel layers can be used, and the number of sacrificial layers will be increased or decreased accordingly. Suitable material for the channel layers 224 includes, for example, Si. Suitable material of the sacrificial layers 222a-222c can be, for example, $SiGe_x$ % where the atomic percent % for "x" ranges from about 15 to about 85% atomic percent. The thickness or height of each sacrificial layers 222 can range from about 5 nm to about 15 nm, and the height of each channel layer 224 can range from about 5 nm to about 15 nm.

FIGS. 6A and 6B illustrate semiconductor structure 200 at a fourth-intermediate fabrication stage. During this stage, sacrificial layers 222a-222c are removed using any suitable one or more wet or dry etching processes such that a channel region 224 can be formed. Next, source/drain region 226 is formed in a similar manner and of a similar material as discussed above for source/drain region 210. Source/drain region 226 can be in-situ doped as with source/drain region 210. In one embodiment, source/drain region 226 is a p-type source/drain region and source/drain region 210 is an n-type source/drain region. In one embodiment, source/drain region 226 is an n-type source/drain region and source/drain region 210 is a p-type source/drain region.

FIGS. 7A and 7B illustrate semiconductor structure 200 at a fifth-intermediate fabrication stage. During this stage, ILD layer 228 is deposited over source/drain regions 226 in a similar manner and of a similar material as ILD layer 212. High-k dielectric layer 230 is formed over channel layers 224a-224c in a similar manner and of a similar material as discussed above. Channel layers 224a-224c form a channel region 224 defined by channel layers 224a-224c. Each of channel regions 224 in top device 200b (see FIG. 13B) are in a stacked, staggered configuration with each of channel regions 208 in bottom device 200a.

FIGS. 8A and 8B illustrate semiconductor structure 200 at a sixth-intermediate fabrication stage. During this stage, an organic planarization layer (OPL) 232 is selectively formed on structure 200. The OPL 232 can be selectively deposited using, e.g., a spin-on coating process. The OPL 232 can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the OPL 232 can include a transparent organic polymer. The OPL can be a standard CxHy polymer. Suitable OPL materials include, for example, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

Next, metal gate connector regions 233 are formed by, for example, forming a photoresist (not shown) on OPL 232 and lithography is performed to pattern the photoresist for forming the metal gate connector regions 233 above a top surface of gate structure 214. Although three metal gate connector regions 233 are shown, it is contemplated that more or less metal gate connector regions 233 are formed in semiconductor structure 200. For example, in one illustrative embodiment, this step is avoided and no metal gate connector regions 233 are formed in semiconductor structure 200. In another non-limiting illustrative embodiment, one metal gate connector regions 233 is formed in semiconductor structure 200. One or more selective dry or wet etching processes are performed to remove the OPL layer 232 and substrate 220 to expose a top surface of gate 214 in the bottom device.

FIGS. 9A and 9B illustrate semiconductor structure 200 at a seventh-intermediate fabrication stage. During this stage, OPL 232 is removed using any suitable wet or dry etch.

FIGS. 10A and 10B illustrate semiconductor structure 200 at an eighth-intermediate fabrication stage. During this stage, a work function metal layer 234 is formed on high-k dielectric layer 230 employing, for example, CVD, sputtering, or plating. The work function metal includes one or more metals having a function suitable to tune the work function of an n-type field-effect transistor (NFET) or a p-type field-effect transistor (PFET). For example, suitable work function metals include titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

FIGS. 11A and 11B illustrate semiconductor structure 200 at a ninth-intermediate fabrication stage. During this stage, metal gate contact regions are formed by, for example, forming a photoresist (not shown) on work function metal layer 234 and lithography is performed to pattern the photoresist for forming the contact trenches 235 above a top surface of substrate 220. One or more selective dry or wet etching processes are then performed to remove the work function metal layer 234 to expose a top surface of substrate 220 in the top device.

FIGS. 12A and 12B illustrate semiconductor structure 200 at a tenth-intermediate fabrication stage. During this stage, a dielectric material 236 is deposited in the contact trenches 235 by conventional techniques, e.g., CVD, PVD, ALD, etc. Dielectric material 236 can be any suitable dielectric material such as silicon oxide, silicon nitride, hydrogenated silicon carbon oxide, silicon based low-k dielectrics, flowable oxides, porous dielectrics, or organic dielectrics including porous organic dielectrics. Dielectric material 236 can be planarized by, for example, a planarization process such as CMP, if needed.

FIGS. 13A and 13B illustrate semiconductor structure 200 at an eleventh-intermediate fabrication stage. During this stage, a series of interconnects 240, 242, 244 and 246, i.e., power supplies as discussed below, are formed to provide the resulting semiconductor structure 200 including bottom device 200a and top device 200b in which the channel regions are in a staggered configuration. For example, in an illustrative non-limiting embodiment, a layer of dielectric material 238 can be blanket deposited atop the entire structure 200 and planarized following the formation of the contact areas for interconnects 240, 242, 244 and 246. The blanket dielectric may be a silicon-based material, such as $SiO_2$, $Si_3N_4$, SiOxNy, SiC, SiCO, SiCOH, and SiCH compounds; the above-mentioned silicon-based materials with some or all of the Si replaced by Ge; carbon-doped oxides; inorganic oxides; inorganic polymers; hybrid polymers; organic polymers such as polyamides or SiLK™, other carbon-based materials; organo-inorganic materials such as spin-on glasses and silsesquioxane-based materials; and diamond-like carbon (DLC, also known as amorphous hydrogenated carbo). Additional choices for the blanket dielectric include any of the aforementioned materials in porous form, or in a form that changes during processing to or from being porous and/or permeable to being non-porous and/or non-permeable. The deposited dielectric 238 is then patterned and etched to form via holes for interconnects 240, 242, 244 and 246.

Following via formation, metal interconnects 240, 242, 244 and 246 are formed by depositing a conductive metal into the via holes using deposition methods, such as CVD or plating, to form a series of power supplies. The conductive metal may include, but is not limited to, tungsten, copper, aluminum, silver, gold and alloys thereof. In one embodiment, interconnect 240 serves as a ground (GND) rail, interconnect 242 serves as a supply (VDD) rail to provide supply voltage to the structure 200, interconnect 244 connects the source/drain region 226 in the top device with the source/drain region 210 in the bottom device to serve as an output, Vout, for the semiconductor structure 200, and interconnect 246 is a gate contact and serves as input, Vin, for the semiconductor structure 200. Other interconnects can be formed and connected to, for example, VSS (not shown).

Figure 14:
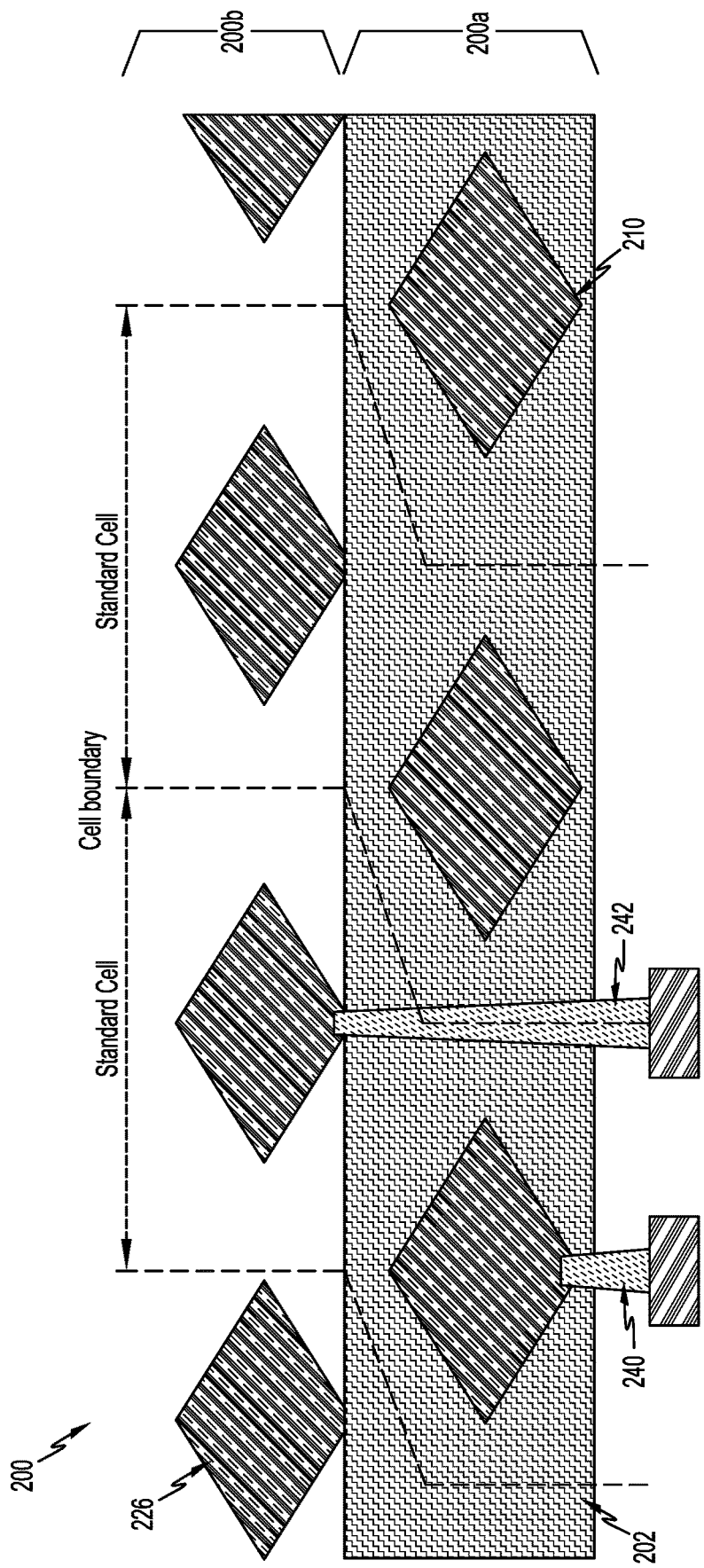
FIG. 14 is a cross-sectional view illustrating a backside of the semiconductor structure of FIG. 13B, according to an illustrative alternative embodiment.

As one skilled in the art will readily appreciate, the resulting semiconductor structure 200 advantageously allows for formation of the power supplies on one or more of a frontside and a backside of the structure 200. As depicted in FIG. 13B each of the metal interconnects 240, 242, 244 and 246 are formed on the frontside of semiconductor structure 200. In one illustrative non-limiting embodiment, FIG. 14 shows semiconductor structure 200 having power supply 240 and power supply 242 formed on the backside of the structure 200. In this embodiment, interconnect 240 serves as a ground (GND) rail, and interconnect 242 serves as a supply (VDD) rail to provide supply voltage to the structure 200. In addition, the structure 200 depicted in FIG. 13B shows that the cell boundary for the top active areas is not aligned with the cell boundary of the bottom active areas.

Figure 15:
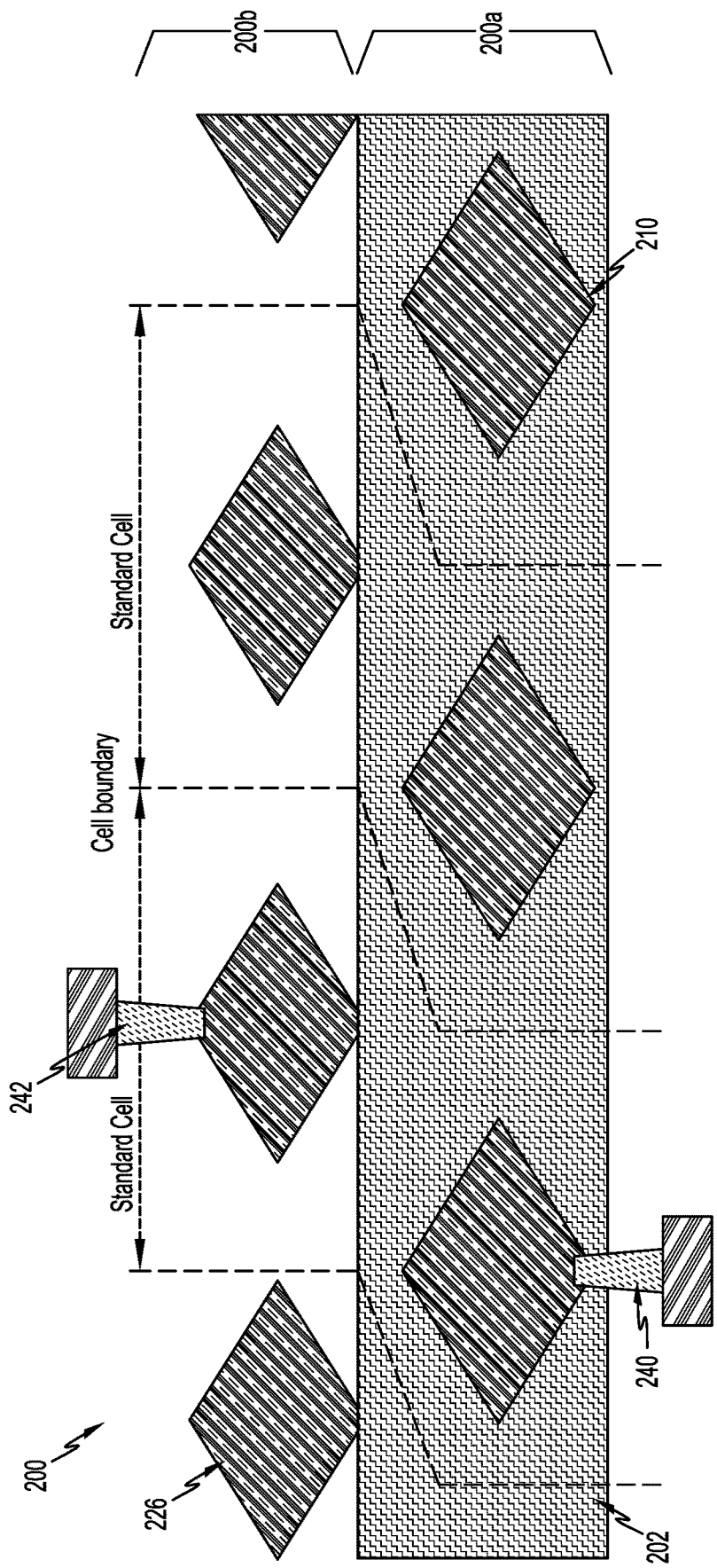
FIG. 15 is a cross-sectional view illustrating a backside of the semiconductor structure of FIG. 13B, according to an illustrative alternative embodiment.

In another illustrative non-limiting embodiment, FIG. 15 shows semiconductor structure 200 having interconnect 240 formed on the backside of the structure 200, and interconnect 242 formed on the frontside of the structure 200. In this embodiment, interconnect 240 serves as a ground (GND) rail, and interconnect 242 serves as a supply (VDD) rail to provide supply voltage to the structure 200. In addition, the structure 200 depicted in FIG. 15 shows that the cell boundary for the top active areas is not aligned with the cell boundary of the bottom active areas.

Figure 16:
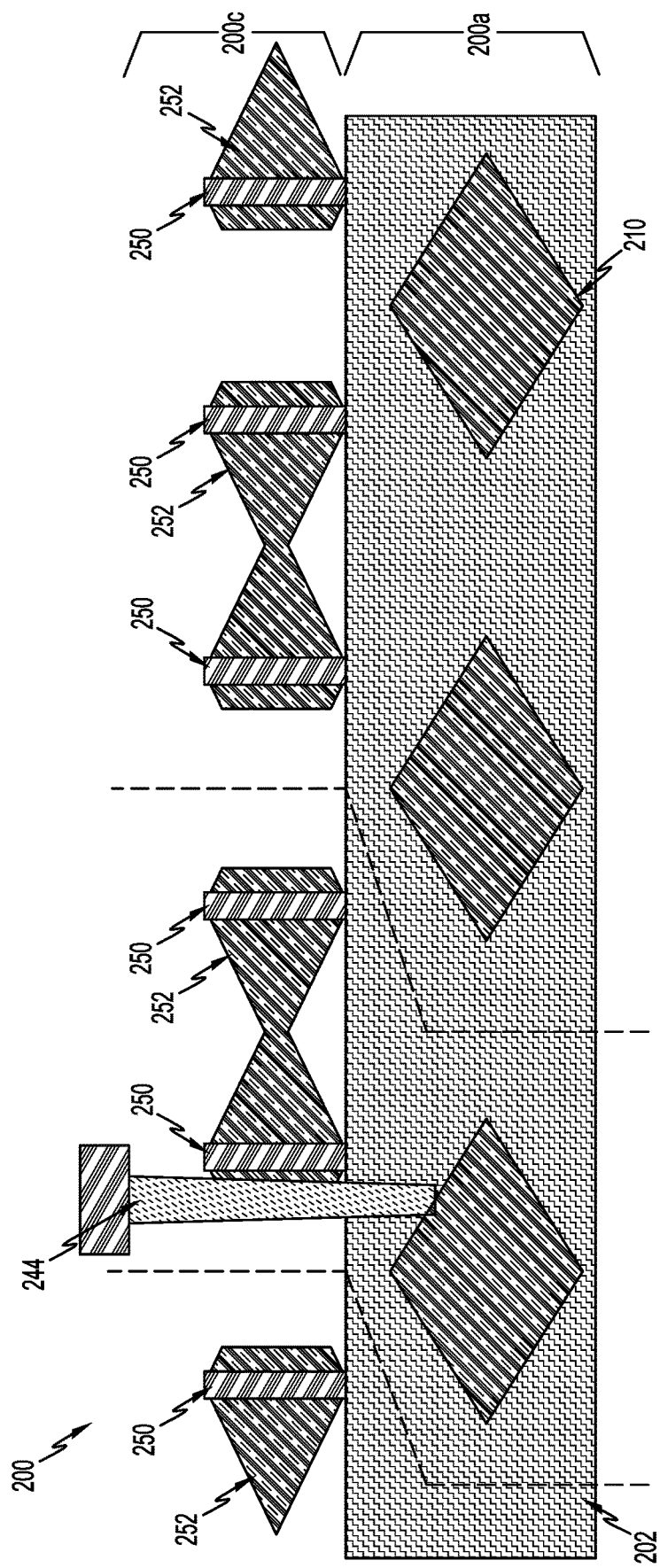
FIG. 16 is a cross-sectional view illustrating a backside of a semiconductor structure, according to an illustrative alternative embodiment.
Figure 17:
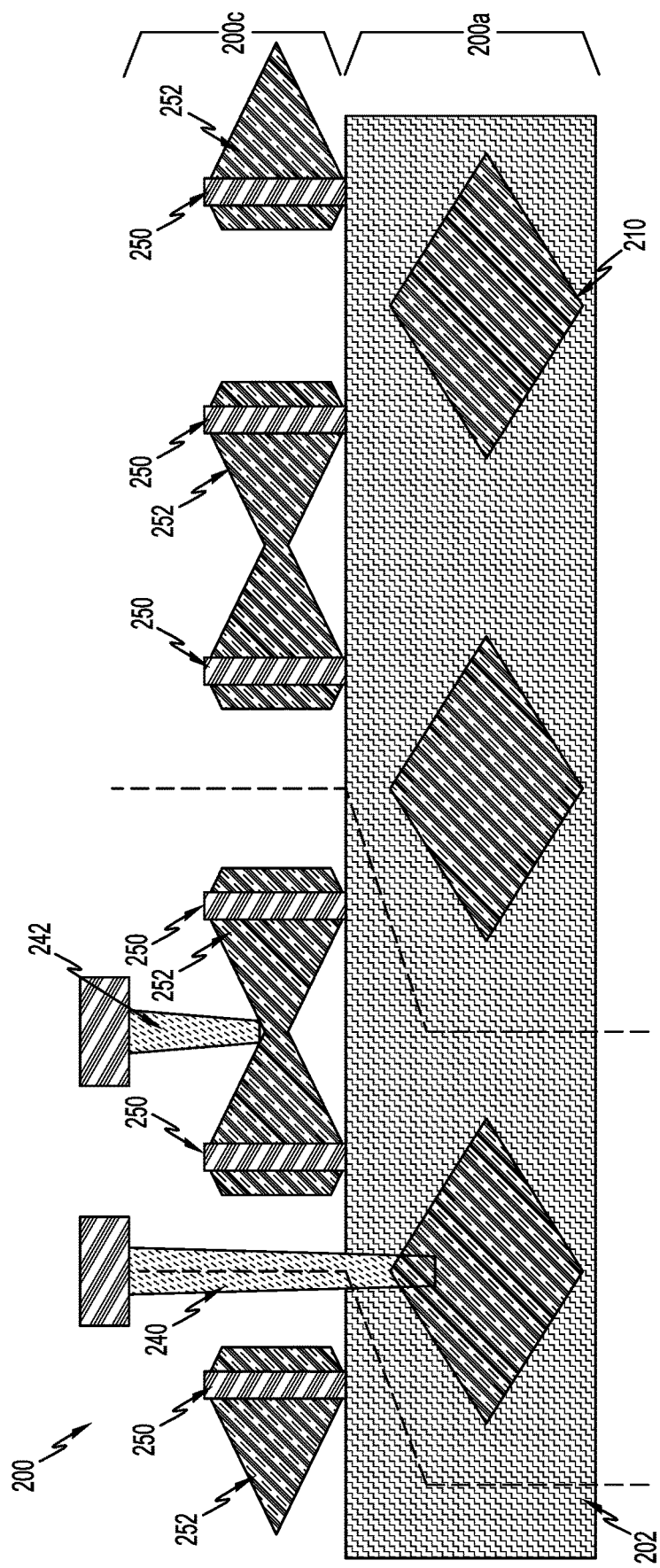
FIG. 17 is a cross-sectional view illustrating a backside of the semiconductor structure, according to an illustrative alternative embodiment.
Figure 18:
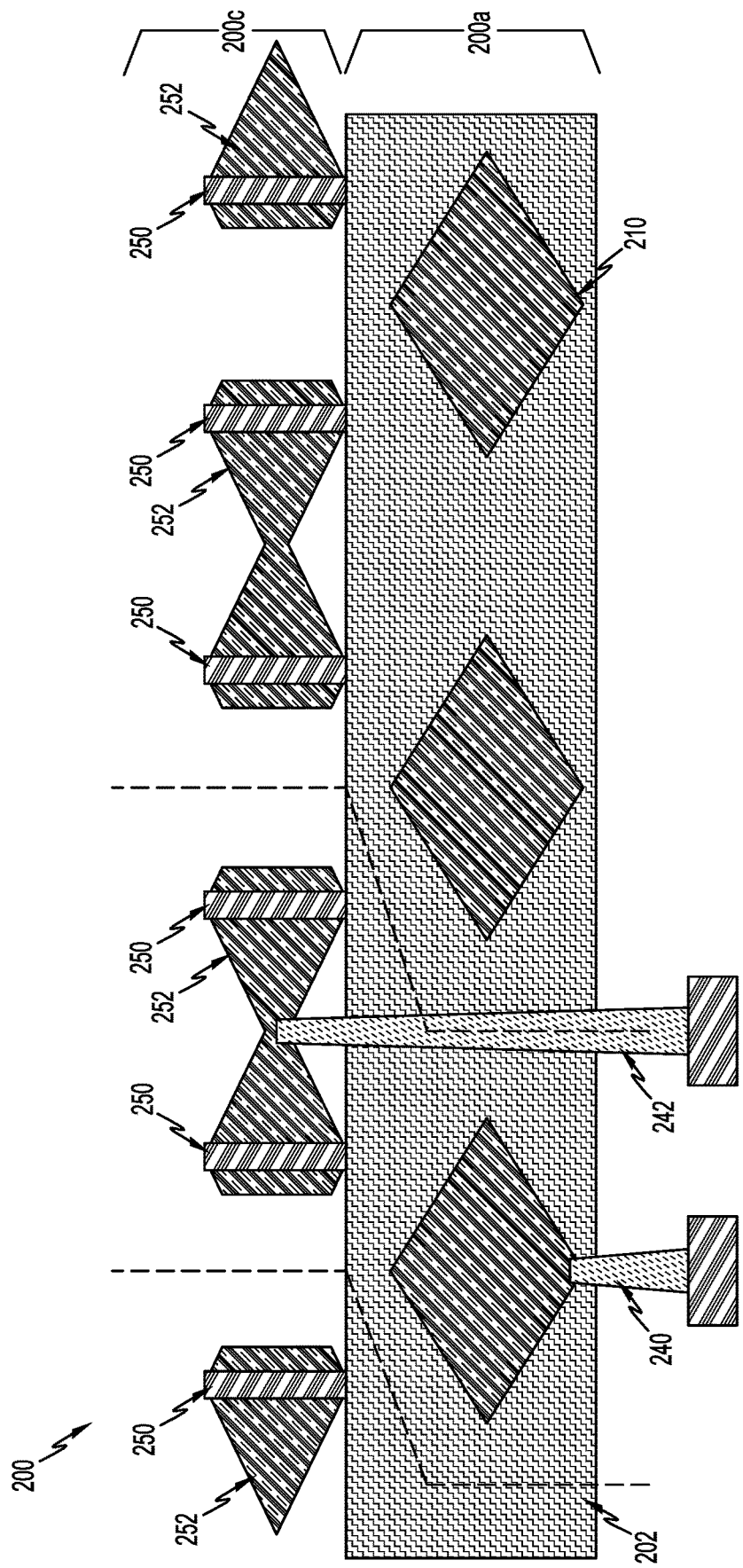
FIG. 18 is a cross-sectional view illustrating a backside of the semiconductor structure, according to an illustrative alternative embodiment.

In illustrative non-limiting embodiments, the resulting semiconductor structure 200 can include any number of combinations of top devices and bottom devices, such as the nanosheet-type FET devices of FIGS. 2-15. For example, FIGS. 16-18 are illustrative non-limiting embodiments showing bottom device 200a being a FET device and top device 200c being a fin-type FET device having at least fins 250 and source/drain regions 252. As one skilled in the art will appreciate, these figures are illustrative and some components of bottom device 200a and top device 200c are left out for illustrative purposes. Methods for forming a fin-type FET device 200c are within the purview of one skilled in the art. Other features of a fin-type FET device are contemplated herein and well within the purview of one skilled in the art.

FIGS. 16-18 further show various illustrative embodiments of interconnects formed on one or more of frontside and a backside of the structure 200. In addition, the structure 200 depicted in FIGS. 16-18 shows that the cell boundary for the top active areas is not aligned with the cell boundary of the bottom active areas.

In one illustrative non-limiting embodiment, FIG. 16 depicts interconnect 244 formed on one side of semiconductor structure 200 and connects the source/drain region 252 in the top device 200c with the source/drain region 210 in the bottom device 200b to serve as an output, Vout, for the semiconductor structure 200.

In another illustrative non-limiting embodiment, FIG. 17 shows semiconductor structure 200 having interconnect 240 and interconnect 242 formed on the same side of the top device 200c of the structure 200. In this embodiment, interconnect 240 serves as a ground (GND) rail, and interconnect 242 serves as a supply (VDD) rail to provide supply voltage to the structure 200.

In another illustrative non-limiting embodiment, FIG. 18 shows semiconductor structure 200 having interconnect 240 and interconnect 242 formed on the backside of the structure 200. In this embodiment, interconnect 240 serves as a ground (GND) rail, and interconnect 242 serves as a supply (VDD) rail to provide supply voltage to the structure 200.

In one embodiment, the top device may form a PFET transistor and the bottom device may form an NFET transistor. However, the illustrative embodiments are to be limited and may include structures in which the transistor of the bottom device and the transistor of the top device may be a PFET and PFET, an NFET and NFET, or a NFET and PFET respectively.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A semiconductor structure, comprising:
   a first transistor device comprising a plurality of channel regions disposed on a first substrate and a plurality of first gate structures each disposed on and around a given channel region of the plurality of channel regions; and
   a second transistor device comprising a plurality of channel regions disposed on a second substrate and a plurality of second gate structures each disposed on and around a given channel region of the plurality of channel regions;
   wherein the first transistor device and the second transistor device are in a stacked configuration;
   wherein the plurality of channel regions of the first transistor device are in a staggered configuration relative to the plurality of channel regions of the second transistor device; and
   wherein at least one of the plurality of first gate structures of the channel regions of the first transistor device is in contact with a respective second gate structure of the plurality of second gate structures of the channel regions of the second transistor device through a gate connector region in the second substrate.

2. The semiconductor structure of claim 1, further comprising a first metal interconnect and a second metal interconnect, each disposed in one or more of a frontside and a backside of the semiconductor structure.

3. The semiconductor structure of claim 1, wherein the first transistor device further comprises a first source/drain region disposed on and around each of the channel regions of the first transistor device, and the second transistor device further comprises a second source/drain region disposed on and around each of the channel regions of the second transistor device.

4. The semiconductor structure of claim 3, wherein a given one of a second source/drain region of a respective channel region of the second transistor device and a given one of a first source/drain region of a respective channel region of the first transistor device are interconnected with a metal interconnect.

5. The semiconductor structure of claim 1, wherein the staggered configuration comprises the plurality of channel regions of the first transistor device in an overlap configuration relative to the plurality of channel regions of the second transistor device.

6. The semiconductor structure of claim 1, wherein the first transistor device is one of a nanosheet-type field effect transistor device and a fin-type field effect transistor device, and the second transistor device is another one of a nanosheet-type field effect transistor device and a fin-type field effect transistor device.

7. The semiconductor structure of claim 1, wherein the semiconductor structure is part of a logic device.

8. The semiconductor structure of claim 1, wherein the at least one of the plurality of first gate structures in contact with the respective second gate structure through the gate connector region in the second substrate comprises a continuous gate structure.

9. An integrated circuit, comprising:
one or more semiconductor structures, wherein at least one of the one or more semiconductor structures comprises:
a first transistor device comprising a plurality of channel regions disposed on a first substrate and a plurality of first gate structures each disposed on and around a given channel region of the plurality of channel regions; and
a second transistor device comprising a plurality of channel regions disposed on a second substrate and a plurality of second gate structures each disposed on and around a given channel region of the plurality of channel regions;
wherein the first transistor device and the second transistor device are in a stacked configuration;
wherein the plurality of channel regions of the first transistor device are in a staggered configuration relative to the plurality of channel regions of the second transistor device; and
wherein at least one of the plurality of first gate structures of the channel regions of the first transistor device is in contact with a respective second gate structure of the plurality of second gate structures of the channel regions of the second transistor device through a gate connector region in the second substrate.

10. The integrated circuit of claim 9, wherein the at least one of the one or more semiconductor structures further comprises a first metal interconnect and a second metal interconnect, each disposed in one or more of a frontside and a backside of the semiconductor structure.

11. The integrated circuit of claim 9, wherein the first transistor device further comprises a first source/drain region disposed on and around each of the channel regions of the first transistor device, and the second transistor device further comprises a second source/drain region disposed on and around each of the channel regions of the second transistor device.

12. The integrated circuit of claim 11, wherein a given one of a second source/drain region of a respective channel region of the second transistor device and a given one of a first source/drain region of a respective channel region of the first transistor device are interconnected with a metal interconnect.

13. The integrated circuit of claim 9, wherein the staggered configuration comprises the plurality of channel regions of the first transistor device in an overlap configuration relative to the plurality of channel regions of the second transistor device.

14. The integrated circuit of claim 9, wherein the first transistor device is one of a nanosheet-type field effect transistor device and a fin-type field effect transistor device, and the second transistor device is another one of a nanosheet-type field effect transistor device and a fin-type field effect transistor device.

15. The integrated circuit of claim 9, wherein the at least one of the plurality of first gate structures in contact with the respective second gate structure through the gate connector region in the second substrate comprises a continuous gate structure.

16. A semiconductor structure, comprising:
a first transistor device comprising a plurality of channel regions disposed on a first substrate and a plurality of first gate structures each disposed on and around a given channel region of the plurality of channel regions;
a second transistor device comprising a plurality of channel regions disposed on a second substrate and a plurality of second gate structures each disposed on and around a given channel region of the plurality of channel regions;
a first metal interconnect; and
a second metal interconnect;
wherein the first metal interconnect and the second metal interconnect are disposed in at least one side of the semiconductor structure;
wherein the first transistor device and the second transistor device are in a stacked configuration;
wherein the plurality of channel regions of the first transistor device are in a staggered configuration relative to the plurality of channel regions of the second transistor device; and
wherein at least one of the plurality of first gate structures of the channel regions of the first transistor device is in contact with a respective second gate structure of the plurality of second gate structures of the channel regions of the second transistor device through a gate connector region in the second substrate.

17. The semiconductor structure of claim 16, wherein the at least one side of the semiconductor structure that the first metal interconnect and the second metal interconnect are disposed in comprises at least one of a frontside and a backside of the semiconductor structure.

18. The semiconductor structure of claim 16, wherein the first transistor device further comprises a first source/drain region disposed on and around each of the channel regions of the first transistor device, and the second transistor device further comprises a second source/drain region disposed on and around each of the channel regions of the second transistor device.

19. The semiconductor structure of claim 18, wherein a given one of a second source/drain region of a respective channel region of the second transistor device and a given one of a first source/drain region of a respective channel region of the first transistor device are interconnected with a third metal interconnect.

20. The semiconductor structure of claim 16, wherein the staggered configuration comprises the plurality of channel regions of the first transistor device in an overlap configuration relative to the plurality of channel regions of the second transistor device.

21. The semiconductor structure of claim 16, wherein the first transistor device is one of a nanosheet-type field effect transistor device and a fin-type field effect transistor device, and the second transistor device is another one of a nanosheet-type field effect transistor device and a fin-type field effect transistor device.

22. The semiconductor structure of claim 17, wherein the first metal interconnect and the second metal interconnect are each disposed in the frontside of the semiconductor structure, or in the backside of the semiconductor structure, or one of the first metal interconnect and the second metal interconnect in the frontside and the other of the first metal interconnect and the second metal interconnect in the backside of the semiconductor structure.

23. The semiconductor structure of claim 16, wherein the at least one of the plurality of first gate structures in contact with the respective second gate structure through the gate connector region in the second substrate comprises a continuous gate structure.

24. A method, comprising:
forming a first transistor device comprising a plurality of channel regions and a plurality of first gate structures each disposed on and around a given channel region of the plurality of channel regions on a first substrate; and forming a second transistor device comprising a plurality of channel regions and a plurality of second gate structures each disposed on and around a given channel region of the plurality of channel regions on a second substrate;

wherein the first transistor device and the second transistor device are formed in a stacked configuration; and wherein the plurality of channel regions of the first transistor device are formed in a staggered configuration relative to the plurality of channel regions of the second transistor device; and wherein at least one of the plurality of first gate structures of the channel regions of the first transistor device is in contact with a respective second gate structure of the plurality of second gate structures of the channel regions of the second transistor device through a gate connector region in the second substrate.

25. A method for forming a semiconductor structure, comprising:

forming a first transistor device comprising a plurality of channel regions and a plurality of first gate structures each disposed on and around each channel region disposed on a first substrate;

forming a second transistor device comprising a plurality of channel regions and a plurality of second gate structures each disposed on and around each channel region disposed on a second substrate;

forming a first metal interconnect; and forming a second metal interconnect;

wherein the first metal interconnect and the second metal interconnect are formed in at least one side of the semiconductor structure;

wherein the first transistor device and the second transistor device are formed in a stacked configuration;

wherein the plurality of channel regions of the first transistor device are formed in a staggered configuration relative to the plurality of channel regions of the second transistor device; and wherein at least one of the plurality of first gate structures of the channel regions of the first transistor device is in contact with a respective second gate structure of the plurality of second gate structures of the channel regions of the second transistor device through a gate connector region in the second substrate.

* * * * *